United States Patent
Radens et al.

(10) Patent No.: US 6,180,975 B1
(45) Date of Patent: Jan. 30, 2001

(54) DEPLETION STRAP SEMICONDUCTOR MEMORY DEVICE

(75) Inventors: Carl J. Radens, LaGrargeville; Mary Weybright, Pleasant Valley, both of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/183,306

(22) Filed: Oct. 30, 1998

(51) Int. Cl.[7] .................. H01L 27/108; H01L 29/94; H01L 31/119
(52) U.S. Cl. ................ 257/306; 257/296; 257/301
(58) Field of Search ............... 257/296, 300–310; 438/243–255, 396–399

(56) References Cited

U.S. PATENT DOCUMENTS

| | | | |
|---|---|---|---|
| 3,986,180 | 10/1976 | Cade | 340/173 CA |
| 4,389,705 | 6/1983 | Sheppard | 365/104 |
| 4,907,047 | 3/1990 | Kato et al. | 357/23.6 |
| 5,148,393 | 9/1992 | Furuyama | 365/149 |
| 5,198,995 | 3/1993 | Dennard et al. | 365/149 |
| 5,321,285 | 6/1994 | Lee et al. | 257/296 |
| 5,555,206 | 9/1996 | Uchida et al. | 365/149 |
| 5,617,370 | 4/1997 | Ishikawa | 365/233.5 |
| 5,998,821 | * 12/1999 | Hieda | 257/296 |

* cited by examiner

Primary Examiner—Tom Thomas
Assistant Examiner—Cuong Quang Nguyen
(74) Attorney, Agent, or Firm—H. Daniel Schnurmann

(57) ABSTRACT

A memory cell structure which uses field-effect controlled majority carrier depletion of a buried strap region for controlling the access to a trench-cell capacitor is described. The buried strap connection between the trench capacitor and the bitline contact in regions where the deep trench pattern intersects the active area of the device. The upper section of the trench contains a single crystalline material to minimize the amount of leakage. The memory cell structure includes a field-effect switch having a gate terminal which induces the depletion region in the substrate and the top of the trench, the extent of the depletion region varying as a function of a voltage applied to the gate terminal; a storage device that includes an isolation collar and a capacitor, the depletion region overlapping the isolation collar when the field-effect switch is in an off-state, and the depletion region does not overlap the isolation collar when the field effect switch is in an on-state.

16 Claims, 8 Drawing Sheets

DEPLETION STRAP SEMICONDUCTOR MEMORY DEVICE

FIELD OF THE INVENTION

This invention is related to semiconductor memory devices, and more particularly, to a memory cell structure which uses the field-effect controlled majority carrier depletion of a buried strap region to control the access to a trench-cell capacitor.

BACKGROUND OF THE INVENTION

In the last few years, there has been an increased interest in the electronic industry for trench storage devices commonly used in high density and high speed memory cell devices, such as dynamic random access memory devices (DRAMs) and microprocessors. Research and development efforts are made on an ongoing basis to develop faster and, correspondingly, smaller devices.

DRAMs typically include a switching transistor coupled to a storage capacitor structure. Of late, trench storage have become commonplace in DRAM products due to the high degree of planarity obtainable during wafer manufacturing associated with the trench structure.

One of the challenges associated with trench DRAM processing is the formation of an electrical connection between the trench capacitor and the diffusion region of the array device pass transistor.

A trench DRAM which has been used successfully is a small size device which features a self-aligned (also referred to as a borderless) bitline contact, referred to as a BuriED STrap device (BEST). This DRAM is described in an article by Nesbit et al. entitled "A 0.6 $\mu m^2$ 256Mb Trench DRAM", published in the 1993 IEDM Technical Digest, pp. 627–630. This BEST cell is based on the Merged Isolation and Node Trench (MINT) cell described by Kenney et al. in an article entitled: "A buried-plate trench cell for a 64-Mb DRAM", published in the 1992 Symposium on VLSI Technology Digest of Technical Papers, pp. 14–15. BEST cells are described as having the unique feature of a self-aligned buried strap which is formed at the intersection of the storage trench and the array device. The array device channel region is gated by a field-effect transistor which must be separated from the outdiffused region of the buried strap. Thus, a buried strap connection is made between the top of the trench and the diffusion. The advantage of a buried strap connection resides in the elimination of a distinct lithographic patterning level which allows lowering the cost associated with the manufacturing of the device and improves its overall reliability.

By way of example, a prior art MINT-BEST cell with a self-aligned buried strap is shown in FIG. 1. The N junction diffusion and strap outdiffusion regions are merged forming an electrical connection between the active array device transistor (polysilicon wordline gate conductor "poly WL") at the left side of the figure, and the deep trench capacitor. An inactive (or "passing") wordline gate conductor at the right of FIG. 1 passes over the storage trench and is electrically isolated from the strap and trench regions by an extension of the shallow trench isolation (STI) dielectric.

Deep trenches are conventionally formed into substrate 50 and thin-film 100 (e.g., $Si_3N_4$) using photolithography and reactive ion etch (RIE), with feed gases such as $NF_3$, HBr, $O_2$, $N_2$, $Cl_2$ and HCl. The surfaces are cleaned with a wet solution typically containing HF. Next, a thin node capacitor dielectric 200 is formed on the trench surfaces. An example is low pressure chemical vapor deposition (LPCVD) nitride deposited with source gases $NH_3$ and dichlorosilane. Next, the trench is filled with a conductor to form one plate of the capacitor. In the structure shown in FIG. 1, LPCVD n+ doped polysilicon fill #1 300 is used to form this plate. A dry etch using feed gases such as $SF_6$ planarizes the polysilicon and recesses it down inside the trench. The thin capacitor node dielectric is stripped from the upper portion of the trench which is no longer filled with polysilicon. The collar oxide 400 is then formed using a thermal oxidation in an oxidation containing ambient at 900° C.–1100° C. A dielectric forming the trench collar is deposited, preferably using LPCVD. An anisotropic etch of the collar dielectric creates a collar spacer 400. The etch can be RIE using feed gases such as $CHF_3$, $CF_4$, $C_4F_8$, $C_3FH_8$, $C_2F_6$, $N_2$, $O_2$, and or CO. These steps are not described with drawings since they are know to those skilled in the art of trench capacitor formation.

Practitioners of the art will readily recognize that the collar may also be formed by alternative means, although this is not the subject of this invention.

The MINT-BEST cell described in the aforementioned article suffers from various drawbacks:

1) The presence of the buried strap outdiffusion and variations of the trench placement relative to the gate conductor (GC) of the active array device interferes with the electrical properties of the transistor such as the threshold voltage and the off-current.

2) Variations in the position of the passive wordline on top of the trench can block the ion implantation used to form the array transistor junction which is closest to the trench, and 3) The array cell area compaction is limited by the need to maintain a physical separation between the strap outdiffusion region and the active device channel region.

Other related references that describe depletion of majority carrier devices may be found in U.S. Pat. No. 4,907,407 issued on Mar. 9, 1990 to Kato et al., wherein the depletion transistor is provided on a thick insulator layer having its source and drain regions separated from each other by a channel region and a thin dielectric film formed on the channel region. The transistor device is connected to a storage capacitor typical of DRAM cells.

U.S. Pat. No. 5,198,995 issued to Dennard on Mar. 30, 1993, and of common assignee, describes a substrate-plate trench capacitor type cell structure having a lightly depleted PMOS access device with p+polysilicon gate. Such a device is described having the advantage of providing the DRAM cell with a reduced electric field or a higher stored charge for a given electric field.

As DRAMs increase in storage capacity, it is desired to decrease the amount of chip area required for storing each bit of data. The area of the array needs to be scaled appropriately to adjust the DRAM bit count per chip. A potential scale limitation associated with the trench DRAM array cell structure is introduced by the area required by the pass transistor. Therefore, it is advantageous to place the array transistor directly over the trench or in close proximity to the trench storage capacitor to decrease the area 10 of the array cell.

Various configurations placing the array transistors near the trench storage capacitor have been advanced, e.g., in U.S. Pat. Nos. 5,555,206; 5,148,393; and 3,986,180, wherein the depletion mode device in the DRAM cell is placed in series with the storage capacitor. Alternatively, a configuration described in U.S. Pat. No. 5,321,285, a depletion region adjacent to the source/drain region of the transistor is used as a storage cell in a memory array.

However, the above described structures suffer from a drawback in that the transistor and capacitor regions occupy adjacent regions of the layout and do not overlap. Hence, examples of the prior art cannot be compacted to accommodate cell scaling and further miniaturization. Additionally, the above-described structures rely on the formation of an inversion layer to modulate conduction in the channel region.

OBJECTS OF THE INVENTION

Accordingly, it is an object of the present invention to provide a field-effect controlled majority carrier depletion device with a buried strap region for controlling the access to a trench-cell capacitor.

It is another object of the invention to provide a depletion transfer device with a gate overlapping or positioned directly over the trench capacitor.

It is yet another object of the invention to have the buried strap connection between the trench capacitor and the bitline contact in regions where the deep trench (DT) pattern intersects the active area (AA) of the device, and the upper section of the trench contains a single crystalline material in order to minimize the amount of leakage.

It is still another object of the invention to have the structure and the process for fabricating the structure enable the trench storage capacitor and the array pass transistor to be formed directly on top or overlapping the buried strap to permit a reduction in the DRAM array cell area.

SUMMARY OF THE INVENTION

In accordance with the present invention, the conventional channel MOSFET (Metal Oxide Silicon Field-Effect Transistor) device used in the DRAM array is replaced with a gate-controlled field-effect device which depletes or accumulates the majority carriers in a buried strap region under control of an electric field generated by the device gate. The depth of the depletion region under the device can be controlled by the voltage on the device gate and by the design of the doping profile in the region under the gate. When the array device is in an off state, the region under the gate is depleted below the depth of the trench isolation collar, the majority carrier conduction though the depleted region is minimized, and the signal charge is contained within the trench capacitor. The trench is electrically isolated from the bitline contact. In the off-state, charge is stored in trench capacitor. When the array device is in the on-state, the region under the gate contains an accumulation of majority carriers and a conductive pathway is made between the bitline contact and the trench capacitor. In the on-state, charge may be written into or read out of the storage capacitor.

In a first aspect of the present invention there is provided a monolithic memory device formed in a substrate that includes a field-effect switch having a gate terminal, the gate terminal inducing a depletion region in the substrate, the extent of the depletion region varying as a function of a voltage applied to the gate terminal; and a storage device including an isolation collar and a capacitor such that the depletion region overlaps the isolation collar when the field-effect switch is in an off-state, and the depletion region does not overlap the isolation collar when the field-effect switch is in an on-state.

In a second aspect of the invention there is provided a monolithic memory device formed in a substrate that includes: a field-effect switch having a gate terminal, the gate terminal inducing a depletion region in the substrate, the extent of the depletion region varying as a function of a voltage applied to the gate terminal; and a storage device including an isolation collar and a capacitor such that the extent of the depletion region merging with any portion of the isolation collar induces an off-state in the field-effect switch.

BRIEF DESCRIPTION OF THE DRAWINGS

The features, aspects and advantages of the semiconductor memory device according to the present invention will be more clearly understood from the following description taken in conjunction with the accompanying drawings in which.

DETAILED DESCRIPTION OF THE PREFERRED EMBODIMENT

Figure 1A:
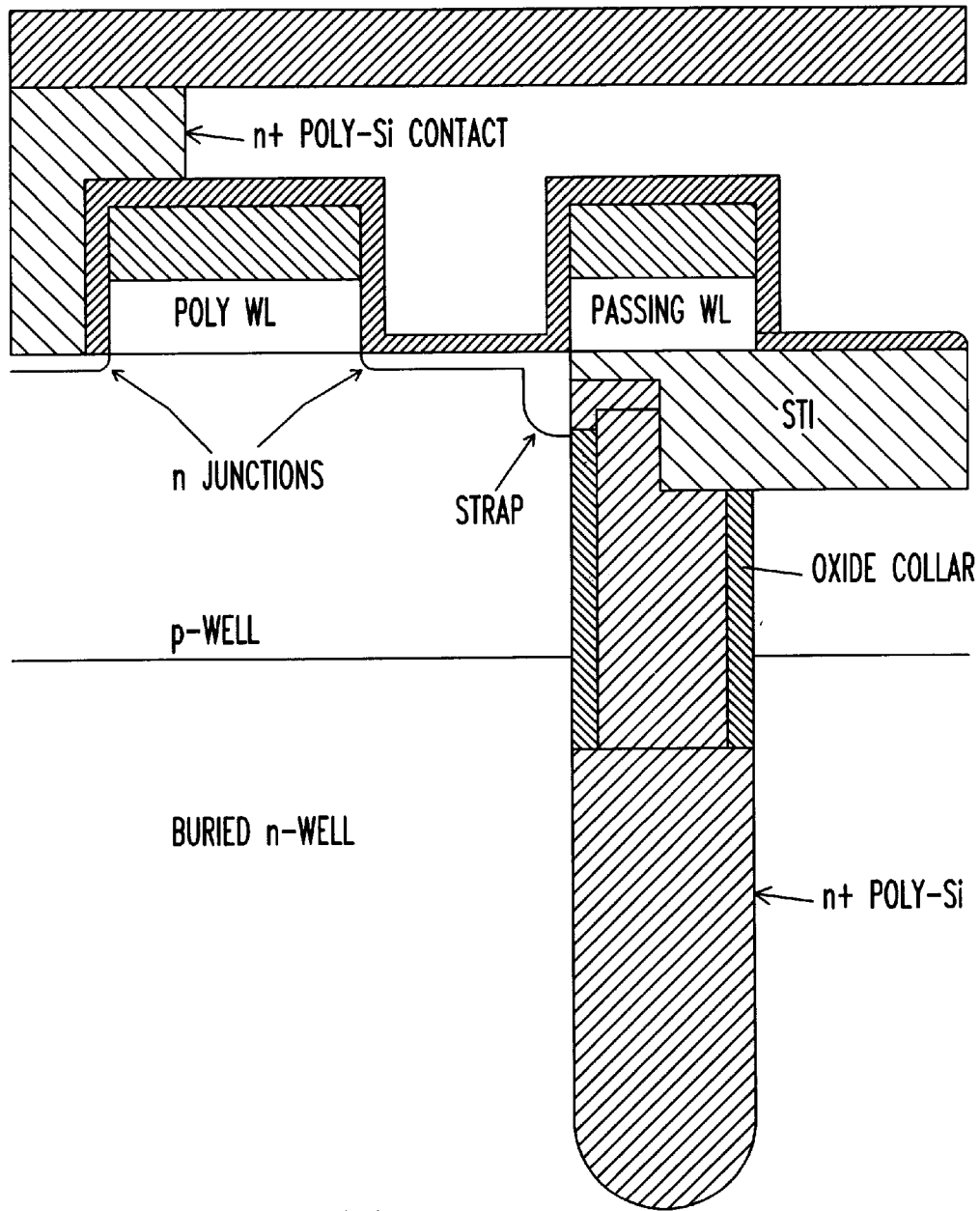
FIG. 1A shows a cross-sectional view of a prior art MINT cell depicting the upper region of a trench, and wherein a doped polysilicon deposition is placed within a collar surrounding the outer surface of the trench.
Figure 1B:
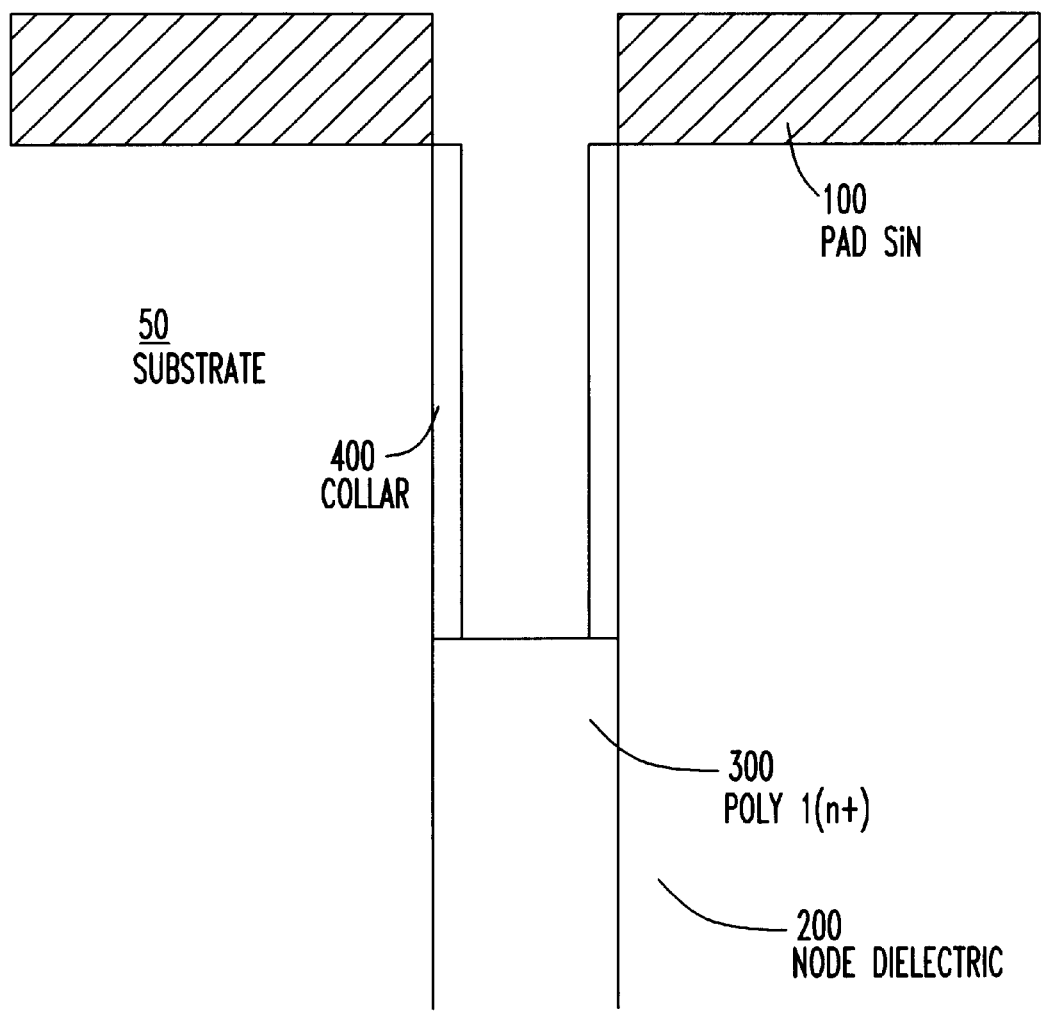
FIG. 1B shows a prior art trench and partial polysilicon fill after formation of the isolation collar.

The structure and the process for fabricating the structure in accordance with the invention will now be described. First the trench, node dielectric, and dielectric trench collar are formed as it was previously described in the Background of the Invention with reference to FIG. 1A.

Figure 2:
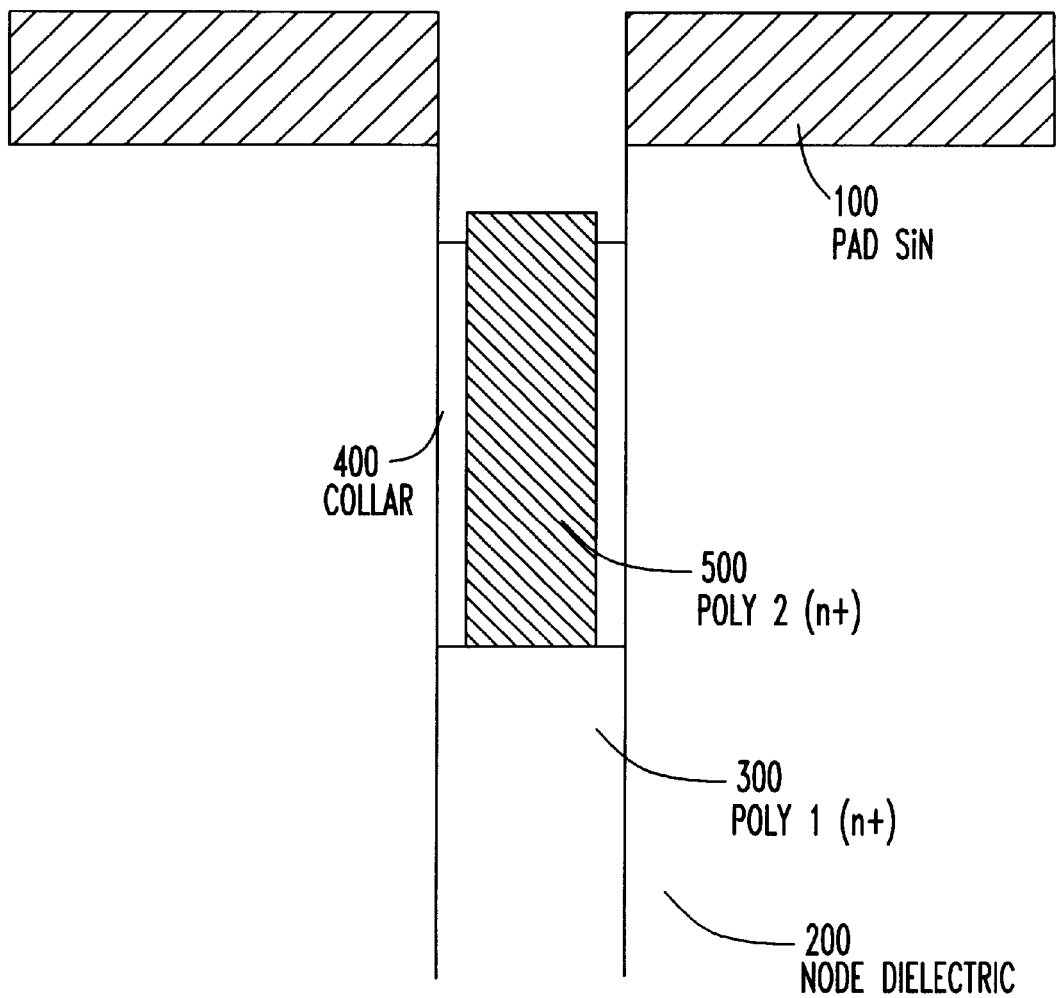
FIG. 2 shows a prior art fill in the upper region of the trench recessed below the pad dielectric and the isolation collar removed from the top region of the trench.

Following the above steps, LPCVD n+ polysilicon 500 is deposited and planarized to fill the trench, while ensuring that it remains co-planar with the material surrounding the trench. This result can be achieved using any known techniques such as, e.g., chemical-mechanical planarization (CMP). Next, polysilicon is selectively etched or recessed down from the top of the trench, an etch which can, advantageously, be achieved using dry plasma. The collar dielectric at the top of the trench is then etched down to the depth of the polysilicon surface, preferably, through the use of an isotropic wet chemical etch. The resulting structure up to this point is shown in FIG. 2.

Figure 3:
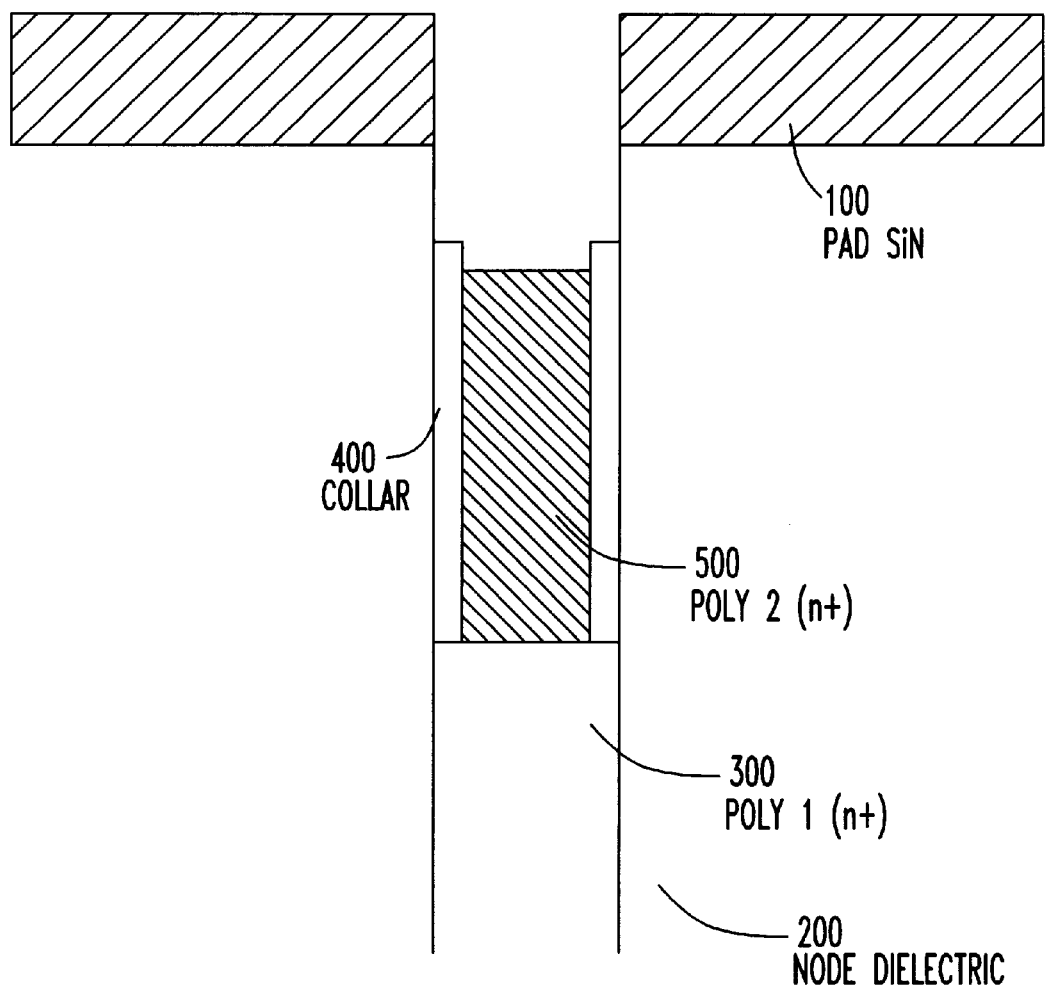
FIG. 3 shows a cross-sectional view of the polysilicon recessed below the depth of the isolation collar, in accordance with the invention.

Referring now to FIG. 3, there is shown the poly #2 recessed below the depth of the isolation collar 400. This is achieved by an anisotropic dry plasma etch that utilized $SF_6$. The poly #2 500 must be recessed below the height of the isolation collar with the objective in mind that the subsequent silicon deposited for the strap region is deposited epitaxially to follow the single-crystal substrate and not the random grain orientation of the poly #2. This is necessary for achieving a low leakage depletion strap device. Just before the epitaxial deposition, a pre-bake containing $H_2$ at temperatures between 850° C. and 1100° C. can be used to remove native oxide from the sidewall surface of the singe-crystal substrate.

Figure 4:
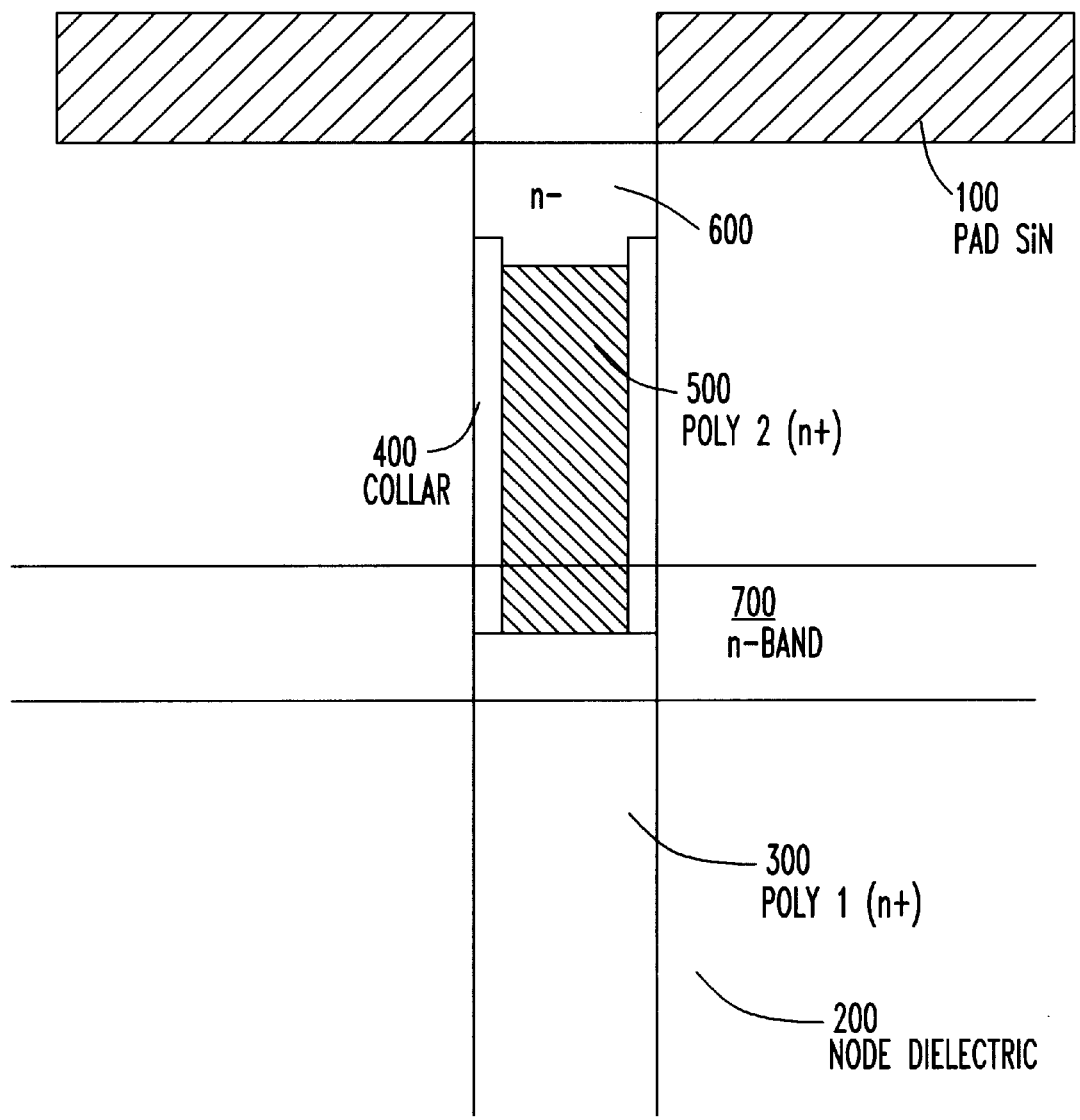
FIG. 4 shows the n-epitaxial silicon in the strap region after planarization and recess to the level of the substrate.

The epitaxial silicon 600 shown in FIG. 4 can be formed using chemical vapor deposition (CVD) in the strap region. The epitaxial growth conditions are selected so as to inhibit silicon deposition on the surface of the dielectric thin-film 100 and on the collar 500 as, for instance, by including HCl in the source gases. This selective epitaxial deposition is not a central feature of this invention. The microcrystalline or poly-crystalline region of the silicon 600 grown in proximity to poly #2 500 is localized below the depth of the collar.

Next, silicon 600 can be planarized with CMP or utilizing dry plasma etch to planarize it with dielectric thin-film 100 surrounding the trench. The silicon 600 is recessed down to the level of the silicon substrate dielectric thin-film 100 interface (FIG. 4). An optional band of n-type doping 700 can be ion-implanted at this particular time. It provides a junction isolation between the upper surface of the silicon (which will be doped p-type) and the substrate, in this case also p-type. Next, a well is implanted that further isolates the device. In the case of a n-type doped buried strap, the well will be p-type; if it is an p-type doped buried strap, the well will be n-type. The well is implanted with a surface concentration and doping profile designed to optimize the device operation. Typical surface concentrations for the well range from 1e17/cm to $1e18/cm^3$. It is worth noting that the depth of the well may reach all the way down to the buried plate (typically, from 500 to 1000 nm).

Figure 5:
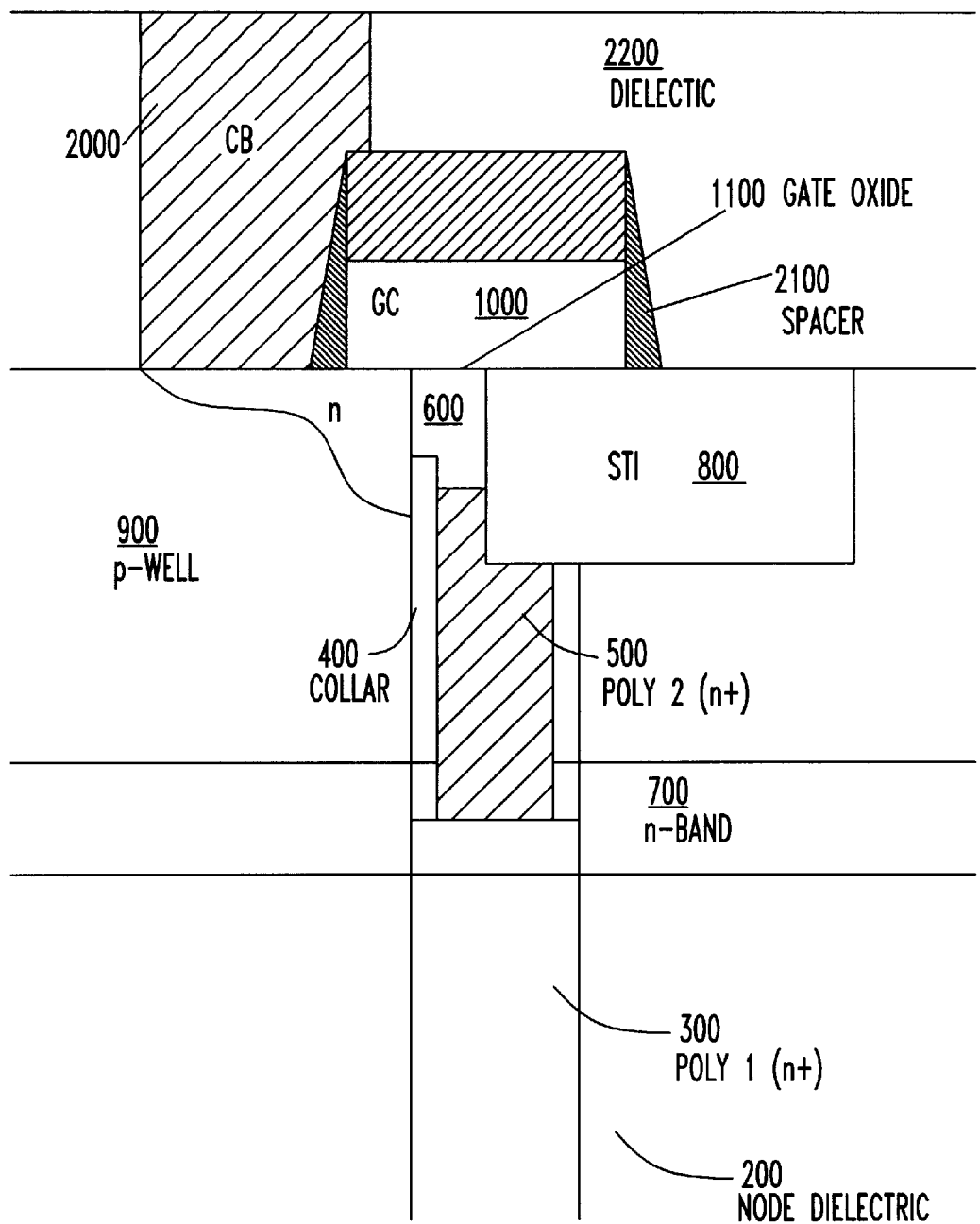
FIG. 5 shows the trench capacitor and depletion-strap device after formation of the shallow trench isolation (STI)

FIG. 5 shows the trench capacitor and depletion-strap device after formation of the shallow-trench isolation 800 (STI) by RIE, and dielectric deposition such as LPCVD or planarization, such as CMP. The STI serves to electrically isolate regions of the wafer from adjacent regions. The transistor gate oxide 1100 is grown by standard thermal oxidation. The LPCVD gate stack 1000 conductor is formed using standard lithographic and dry etching techniques. Likewise, a bitline diffusion contact (CB) 2000 is formed adjacent to the device employing standard processing techniques, and a p-well 900 is constructed using ion implantation and standard techniques.

Still referring to FIG. 5, a shallow trench 800 is defined using photolithography and resist. The resist mask has an opening overlapping a portion of the edge and center of the capacitor, leaving a portion of the trench above the collar covered. A reactive ion etch (RIE) that etches silicon and oxide is performed to etch the trench below the depth of the DT collar. The resist mask is stripped. The shallow trench is then filled by depositing an oxide over the wafer, etching it back and planarizing it, preferably, using CMP. This provides isolation between the trenches and the devices. The pad nitride is then removed.

Next, gate oxide is grown to a thickness of typically 2–10 nm and is followed by forming the gate conductor of the depletion strap device. A conducting material such as polysilicon, poly-cide, or refractory metal (GC 1000) is deposited to a thickness of about 100–200 nm. A dielectric cap, typically 100–300 nm thick, is deposited on top of the gate conductor. The resist and photolithography define the GC shapes. The GC shapes should cover a portion of the silicon substrate and the trench top 600. The gate conductor is etched with dry etch which stops at the gate oxide. Next, spacers are formed on the walls of the GC by depositing a dielectric of thickness 10–50 nm, and etching it with anisotropic etch until the dielectric is removed from all horizontal surfaces but not from the vertical surfaces 2100.

A contact must be made to the diffusion in the silicon on the opposite side of the gate as the trench capacitor. This is called the bitline contact CB. The contact should be further self-aligned to the gate CB 2000. The CB contact can be built using different approaches. One way is to first deposit a dielectric or a layer of dielectrics that fills the space between GC lines and which electrically isolates the GC lines 2200. A low temperature oxide BSG or BPSG can be used. The dielectric should form a planar surface. In the alternative, either CMP or some other known global planarization technique is used to planarize the dielectric. The CB shapes are patterned next using photolithography and resist. The dielectric is RIE etched with etchback selectivity to the sidewall spacers 2100, the cap dielectric on the GC, and the silicon substrate. The CB shapes only contact the bit line side of the cell. This conductor is, preferably, a refractory metal or, in the alternative, any other metal, or even doped polysilicon. If doped polysilicon is used, the dopant must be of the same type as the buried strap. A thermal cycle is then instituted to allow dopants to diffuse into the silicon and beneath the edge of the gate. The structure is deemed complete once the conductor has been formed into the CB hole. Practitioners in the art will fully realize that to complete the device structure, metal lines and dielectrics must make a connection to the GC and CB contacts.

Figure 6:
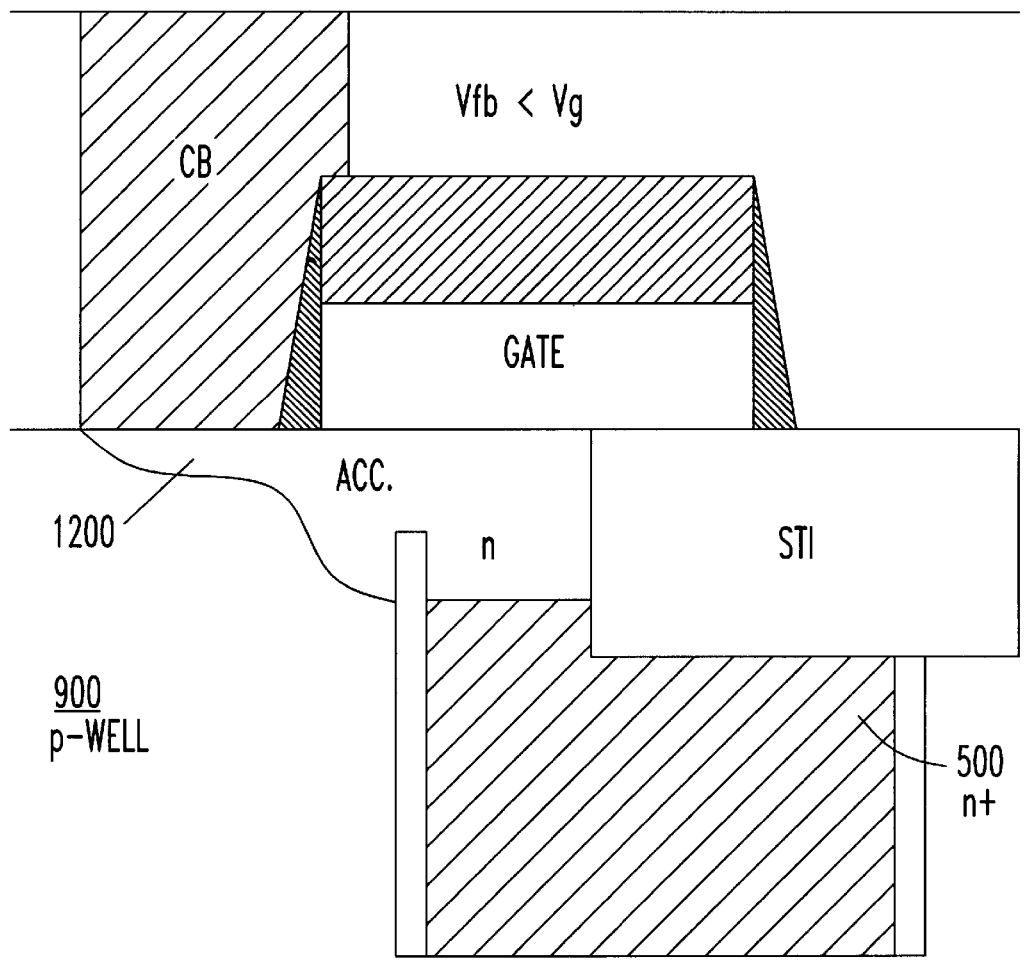
FIG. 6 shows the device in the on-state with the majority carriers accumulated in the strap region under the gate.
Figure 7:
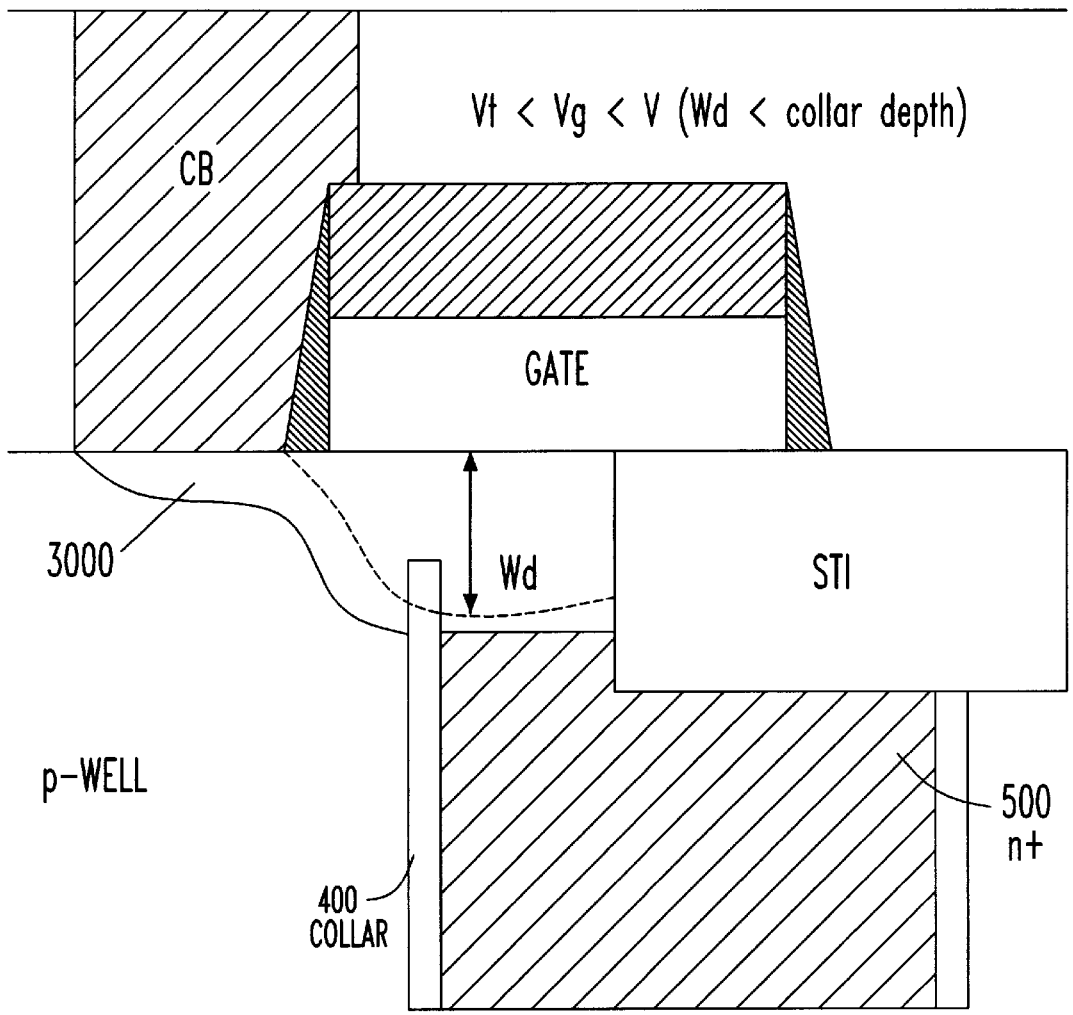
FIG. 7 shows the device shown in FIG. 6 in the off-state.

In order to write a signal onto the capacitor or to read a signal stored in the capacitor of the previously described structure, a bias is applied to the gate which puts the silicon beneath the gate into accumulation. (Note: accumulation occurs when the surface carrier type matches the majority carrier). As shown in FIG. 6, in the case of an ntype buried strap and CB, a positive is applied with buried respect to the strap potential, to the gate to accumulate electrons in the silicon at the region of the buried strap. The electrons form an electrical connection between the bitline contact and the inner electrode of the trench capacitor. The gate voltage Vg must be greater than the flatband voltage Vfb of the device. In order to maintain the charge on the capacitor after the signal has been written, a bias is applied to the gate which induces an electrical field across the gate oxide 1100 in order to deplete all the carriers beneath the gate 3000. The depletion region extends under the silicon substrate surface 50 and must be deeper than the depth of the top edge of the isolation collar between the silicon substrate and the inner electrode Wd 400 (FIG. 7). There is no continuous electrical connection between the bitline contact and the inner trench electrode 500 under this bias condition, and the charge is stored in the capacitor. As it is with all single transistor DRAM cells, leakage from the capacitor can occur.

The doping profile in the buried strap must be chosen such that it provides adequate low resistance between the bitline contact and the conductive plate inside the trench. At the same time, the doping concentration must be sufficiently low to ensure that the majority carriers between the silicon interface with the gate dielectric and the top of the collar can be completely depleted at a voltage that does not damage the gate dielectric.

The doping profile in the buried strap must be chosen to provide adequately low resistance between the bitline contact and the conductive plate within the trench when the device is switched on. At the same time, the doping profile must be low enough to ensure that majority carriers between the gate dielectric and below the top of the collar can be completely depleted at a suitable voltage selected such that it does not damage the gate dielectric when the device is switched off. The buried strap doping can be p-type or n-type. Further, the doping profile can be non-uniform and tailored to optimize the performance of the cell. The doping range would typically vary between 1e17/cm3 and 1e19/cm3.

An example of depletion strap device operating conditions are shown below in TABLE I.

TABLE I

Mode of Operation: Voltage controlled strap resistance

Wd ~ 20 nm @ Nd = 1 e18/cm³, 300° K.
rho ~ 0.01 Ω-cm @ Nd = 1 e¹⁸/cm³
use As or Sb doping (reduced outdiffusion)
Vt ~ −1.1 V @ Nd = 1 e18/cm³, Tox = 6 nm.
Resistance of the strap segment over the collar:

~rho × (collar width)/(strap height × 1F) =
(0.01 Ω-cm × 30 nm)/(20 nm × 150 nm) = 1 KΩ

This is not, however, the only embodiment possible for the device. A second embodiment for a uniformly doped buried strap and 6nm silicon dioxide is 3e17/cm³ giving a strap resistance of 0.03 Ω-cm, a buried strap resistance in the silicon on top of the collar oxide of 3000 Ω, a device threshold voltage of −1.0 V, and a maximum depletion width of 39 nm. Alternatively, the doping profile can be non-uniform and tailored to optimize the performance of the cell. The doping range typically varies between 1e17/cm⁻³ to 1e19/cm⁻³.

While the invention has been particularly shown and described with reference to the preferred embodiment thereof, it will be understood by those skilled in the art that various changes in form and details of the strap device's geometry, electrical parameters, operating conditions, and the like, may be made therein without departing from the spirit and scope of the invention.

What is claimed is:

1. A monolithic memory device formed on a substrate comprising:
   a switching means having a gate terminal, said gate terminal inducing a depletion region in said substrate, the extent of said depletion region varying as a function of a voltage applied to said gate terminal; and
   a storage means comprising an isolation collar and a capacitor, said depletion region overlapping said isolation collar when said switching means is in an off-state, said depletion region inhibiting a majority carrier conduction, and said depletion region not overlapping said isolation collar when said switching means is in an on-state, wherein the absence of said depletion region overlapping said isolation collar enables said majority carrier conduction.

2. The monolithic memory device as recited in claim 1 wherein said gate comprises a conductor isolated from said substrate by an insulating layer.

3. The monolithic memory device as recited in claim 1 wherein said storage means is a capacitor formed in a trench.

4. The monolithic memory device as recited in claim 3 wherein said capacitor includes a first and a second plate, said first plate being comprised of conductive material filling said trench and said second plate is said substrate.

5. The monolithic memory device as recited in claim 4 wherein said first plate is isolated from said second plate by said isolation collar and by a node dielectric insulator.

6. The monolithic memory device as recited in claim 5 wherein said node insulator dielectric provides charge storage between said first and said second plate.

7. The monolithic memory device as recited in claim 1 further comprising a strap connecting said storage means to said switching means.

8. The monolithic memory device as recited in claim 7 wherein said strap is integral to said switching means.

9. The monolithic memory device as recited in claim 8 wherein said depletion region is formed by a junction between a p-type substrate and an n-type diffusion region.

10. The monolithic memory device as recited in claim 1 further comprising a diffusion contact providing a second terminal to said switching means.

11. The monolithic memory device as recited in claim 3 wherein said trench provides a third terminal to said switching means.

12. The monolithic memory device as recited in claim 9 wherein said n-type diffusion region is comprised of an upper section of said trench, by an n-type outdiffusion from said strap region into said substrate, and by an n-type diffusion positioned under said diffusion contact.

13. The monolithic memory device as recited in claim 12 wherein the upper section of said trench is n-type doped and wherein said depletion region overlaps some region of said isolation collar as a function of voltage applied to said gate.

14. A monolithic memory device in a substrate comprising:
   a switching means provided with a gate terminal, said gate terminal inducing a depletion region in said substrate, the extent of said depletion region varying as a function of a voltage applied to said gate terminal; and
   a storage means comprising an isolation collar and a capacitor, wherein the extent of said depletion region merging with any portion of said isolation collar induces an off-state in said switching means, and wherein said merged depletion region with said portion of said isolation collar inhibits a majority carrier conduction.

15. A monolithic memory device in a substrate comprising:
   a switching means provided with a gate terminal, said gate terminal inducing a depletion region in said substrate, the extent of said depletion region varying as a function of a voltage applied to said gate terminal; and
   a storage means comprising an isolation collar and a capacitor, wherein said switching means is in said on-state when said depletion region does not encroach with any portion of said isolation collar, and wherein a lack of said encroachment between said depletion region with said any portion of isolation collar enables a majority carrier conduction.

16. The monolithic memory device as recited in claim 9, wherein said n-type diffusion region and said p-type substrate are respectively substituted with a p-type diffusion region and an n-type substrate.

* * * * *